US009484106B2

(12) United States Patent
Matsui

(10) Patent No.: US 9,484,106 B2
(45) Date of Patent: Nov. 1, 2016

(54) NONVOLATILE SEMICONDUCTOR MEMORY

(71) Applicant: LAPIS SEMICONDUCTOR CO., LTD., Yokohama (JP)

(72) Inventor: Katsuaki Matsui, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 14/963,770

(22) Filed: Dec. 9, 2015

(65) Prior Publication Data

US 2016/0093389 A1  Mar. 31, 2016

Related U.S. Application Data

(62) Division of application No. 14/146,385, filed on Jan. 2, 2014, now Pat. No. 9,245,635, which is a division of application No. 13/161,243, filed on Jun. 15, 2011, now Pat. No. 8,649,220.

(30) Foreign Application Priority Data

Jun. 28, 2010 (JP) ................. 2010-146129

(51) Int. Cl.
*G11C 16/04* (2006.01)
*G11C 16/24* (2006.01)
*G11C 16/26* (2006.01)
(Continued)

(52) U.S. Cl.
CPC ............. *G11C 16/24* (2013.01); *G11C 16/04* (2013.01); *G11C 16/08* (2013.01); *G11C 16/10* (2013.01); *G11C 16/26* (2013.01); *G11C 16/30* (2013.01)

(58) Field of Classification Search
CPC ... G11C 11/5642; G11C 16/26; G11C 16/12; G11C 16/30; G11C 11/2273; G11C 11/2275; G11C 13/004; G11C 11/4091; G11C 11/4094; G11C 2029/1204
See application file for complete search history.

(56) References Cited

U.S. PATENT DOCUMENTS 5,440,518 A  8/1995 Hazani
5,784,327 A  7/1998 Hazani
(Continued)

FOREIGN PATENT DOCUMENTS

JP  2008-027522 A  2/2008

*Primary Examiner* — Son Dinh
*Assistant Examiner* — Uyen B Tran
(74) *Attorney, Agent, or Firm* — Studebaker & Brackett PC

(57) ABSTRACT

A nonvolatile semiconductor memory can reduce variations in an amount of current during data writing operation. This allows for the writing of data to memory cells with high precision. The nonvolatile semiconductor memory includes a plurality of memory cells, word lines connected to the memory cells, and bit lines connected to each of the memory cells. At least two of the bit lines are selected, and a current is simultaneously supplied from a power supply line to those memory cells which are connected to the selected bit lines in order to write data thereto. The nonvolatile semiconductor memory also includes charge amount measurement units for measuring respective amounts of charge stored in the memory cells. The nonvolatile semiconductor memory also includes current path switching circuits connected to the respective bit lines. Those current path switching circuits which are connected to the selected bit lines supply a current from the power supply line to the memory cells or a predetermined terminal depending on a measured value of the amount of charge measured by the charge amount measurement section.

8 Claims, 5 Drawing Sheets

(51) Int. Cl.
  *G11C 16/08* (2006.01)
  *G11C 16/10* (2006.01)
  *G11C 16/30* (2006.01)

(56) References Cited

U.S. PATENT DOCUMENTS 5,905,673 A    5/1999   Khan
6,496,415 B2   12/2002  Tsao
2007/0189067 A1  8/2007  Goodwin
2007/0195585 A1* 8/2007  Sakimura ............... G11C 11/16
                                                    365/158
2009/0190407 A1  7/2009  Satou et al.
2009/0257276 A1  10/2009 Huang et al.
2010/0085799 A1  4/2010  Cho et al.

* cited by examiner

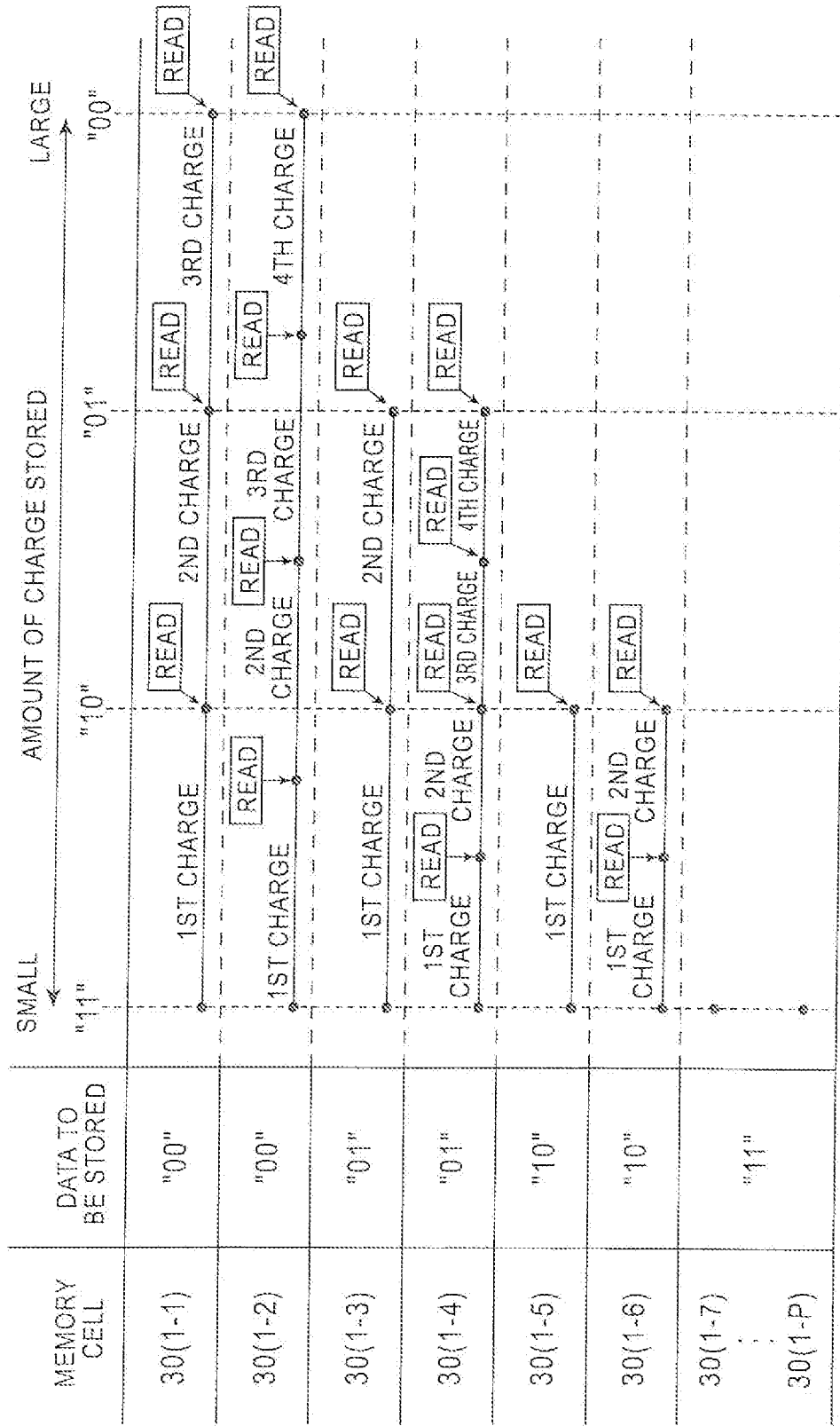

NONVOLATILE SEMICONDUCTOR MEMORY

CROSS REFERENCE TO RELATED APPLICATIONS

This application is a divisional of U.S. patent application Ser. No. 14/146,385, filed Jan. 2, 2014, which is a divisional of Ser. No. 13/161,243 filed Jun. 15, 2011, now U.S. Pat. No. 8,649,220, which claims priority from Japanese Patent Application No. 2010-146129, filed Jun. 28, 2010, the entire contents of which all are incorporated herein by reference.

BACKGROUND OF THE INVENTION

1. Technical Field

The present invention relates to a nonvolatile semiconductor memory capable of electrically erasing and writing data.

2. Background Art

Conventionally, there has been known a nonvolatile semiconductor memory in which a single memory cell has two charge storage sections, and each charge storage section stores two values ("0", "1") so that the single memory cell has two-bit storage capacity. Such a memory cell has an n-type MOSFET (Metal-Oxide-Semiconductor Field-Effect Transistor) structure, for example, and has two charge storage sections spaced apart from each other, i.e., on the drain side and the source side thereof. The state in which a charge is stored in the charge storage section is associated with data "0", for example, and the state in which no charge is stored in the charge storage section is associated with data "1." Thus, it becomes possible to store one-bit data in each charge storage section, i.e., two-bit data per memory cell. The writing, reading, and erasing of data with respect to such a memory cell are performed by a method to be described below, for example.

When writing data "0" to the charge storage section on the drain side, a positive voltage is applied to a drain terminal and a gate terminal, with a source terminal being at a ground voltage. Thus, hot electrons are injected into the charge storage section on the drain side and held therein, so that data "0" is written thereto.

When reading data from the charge storage section on the drain side, a positive voltage is applied to the source terminal and the gate terminal, with the drain terminal being at a ground voltage. In this case, when no charge is stored in the charge storage section on the drain side (i.e., when the charge storage section stores data "1"), a relatively large readout current is obtained. On the other hand, when a charge is stored in the charge storage section on the drain side (i.e., when the charge storage section stores data "0"), the readout current becomes smaller than that when data "1" is stored due to the influence of the stored charge. Since the presence/absence of a charge in the charge storage section causes a difference in the magnitude of the readout current as described above, it becomes possible to read data by determining the relative magnitude of the readout current.

When erasing data in the charge storage section on the drain side, a positive voltage is applied to the drain terminal, a ground voltage or a negative voltage is applied to the gate terminal, and the source terminal is set to an open state. Thus, hot holes generated in the vicinity of a drain region are injected into the charge storage section, and the charge stored in the charge storage section is neutralized, thereby erasing the data.

A nonvolatile semiconductor memory in recent years has a memory array formed by a plurality of MOSFETs, a plurality of bit lines connected to respective sources and drains of the MOSFETs, and a plurality of word lines connected to gates of the MOSFETs and extending perpendicularly to the bit lines. However, since a plurality of MOSFETs are arranged in such a nonvolatile semiconductor memory, there is a problem of a decrease in the writing efficiency. Moreover, since a write voltage is also applied via word lines to those MOSFETs which are connected to non-selected bit lines, a high (strong) electric field generated by such a voltage application causes fluctuation in the threshold voltage (word disturb). Japanese Patent Application Publication (Kokai) No. 2008-27522 discloses a nonvolatile semiconductor memory capable of solving such problems.

In recent years, another type of nonvolatile semiconductor memory has been developed, which includes two charge storage sections in each memory cell (MOSFET) and stores four values of data ("00", "01", "10", "11") in each charge storage section, thus providing 4-bit storage capacity per memory cell. The amount of injected charge is largest when storing "00", the amount of injected charge is relatively large (second largest) when storing "01", the amount of injected charge is relatively small (third largest) when storing "10", and the amount of injected charge is zero when storing "11." Storing of a desired value of data (i.e., 2 bits) in each charge storage section is realized by controlling the amount of charge to be stored in each charge storage section such that the amount of stored charge matches the desired value of data (00, 01, 10 or 11). The way of reading data is similar to that for 2-bit memory cells described above. Specifically, the value of data (00, 01, 10 or 11) is identified by reading the value of the readout current.

Since MOSFETs of memory cells have different characteristics from each other, the amount of time required for storing a predetermined amount of charge (i.e., the writing speed) differs from one MOSFET to another. Therefore, when simultaneously writing one of 4 different values of data to a plurality of memory cells, it is necessary to repeatedly inject a charge, read data, and compare the amount of charge calculated from the read data with the amount of charge to be stored, and to stop the injection of charge only for those MOSFETs for which the calculated amount of charge becomes greater than or equal to the amount of charge to be stored. Specifically, a charge is injected for a predetermined amount of time for each of those MOSFETs which are set to store "00", "01" and "10," and then data is read. The predetermined amount of time is substantially equal to the average amount of time which is taken before the amount of charge in a MOSFET reaches the amount of injected charge necessary for storing "10," for example. Such charge injection and data reading are repeated, and the charge injection is stopped for a MOSFET that is scheduled to store "10" and that has the amount of injected charge for storing "10." By repeating such charge injection and data reading and by stopping the charge injection for a MOSFET that has a scheduled amount of injected charge, all MOSFETs will have predetermined amounts of injected charge, thus completing the writing of the data to the entire nonvolatile semiconductor memory.

If charge injection and data reading are repeated, and the charge injection is stopped for any MOSFET, then the load of the nonvolatile semiconductor memory varies before and after the charge injection is stopped. This causes the varying of the amount of current flowing through the nonvolatile semiconductor memory and the MOSFETs. It is difficult to predict the variations in the amount of current because it is difficult to predict the amount of time necessary for each MOSFET to reach a predetermined amount of charge and because data to be written also varies depending on the use condition (operation condition) of the nonvolatile semiconductor memory.

If such variations in the amount of current occur, there may be a MOSFET into which the charge is injected excessively so that an amount of charge injected therein is larger than the predetermined amount of charge associated with data scheduled to be stored. With the variations in the load of the nonvolatile semiconductor memory, excessive current flows through the nonvolatile semiconductor memory so that an amount of charge associated with "01" or "00" is injected into a MOSFET into which an amount of charge associated with "10" should be injected.

SUMMARY OF THE INVENTION

An object of the present invention is to provide a nonvolatile semiconductor memory capable of suppressing variations in the amount of current during data writing operation in order to perform the writing of data to memory cells with high precision.

According to one aspect of the present invention, there is provided a nonvolatile semiconductor memory that includes a plurality of memory cells, word lines connected to the memory cells, and bit lines crossing the word lines and connected to the memory cells, respectively. At least two of the bit lines are selected, and a current is simultaneously supplied from a power supply line to those memory cells which are connected to the selected bit lines so as to write data to these memory cells. The nonvolatile semiconductor memory also includes charge amount measurement sections for measuring respective amounts of charge stored in the memory cells. The nonvolatile semiconductor memory also includes current path switching circuits connected to the respective bit lines. Each of those current path switching circuits which are connected to the selected bit lines supplies a current from the power supply line to the memory cell concerned or a predetermined terminal depending on a measured value of the amount of charge measured by the charge amount measurement section associated with the memory cell concerned.

In this semiconductor memory, the current path switching circuits are connected to the memory cells to which data is written simultaneously. Therefore, even a current path switching circuit that is connected to a memory cell for which write has been completed receives a current equal to or less than that during the writing operation, this current flows to the ground potential via a bypass circuit. This prevents the load fluctuations in the nonvolatile semiconductor memory and also prevents the fluctuations of current flowing through the nonvolatile semiconductor memory and memory cells being written. Therefore, the nonvolatile semiconductor memory of the present invention is capable of writing data to each memory cell with high precision while suppressing variations in the amount of current during data writing operation.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 5 shows changes in amounts of charge stored in memory cells of the nonvolatile semiconductor memory shown in FIG. 1.

DETAILED DESCRIPTION OF THE INVENTION

An embodiment of the present invention will now be described in detail with reference to the accompanying drawings.

Figure 2:
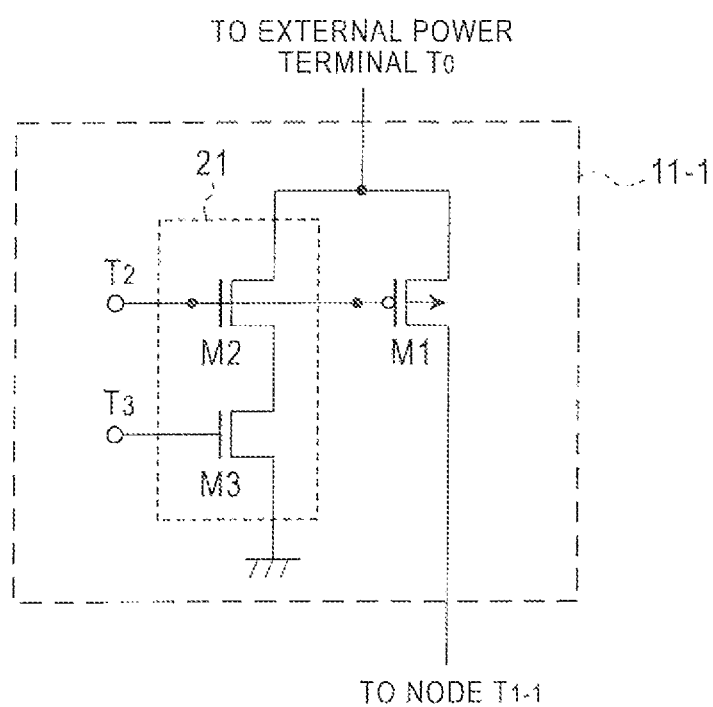
FIG. 2 shows a schematic configuration of a current path switching circuit of the nonvolatile semiconductor memory shown in FIG. 1.
Figure 3:
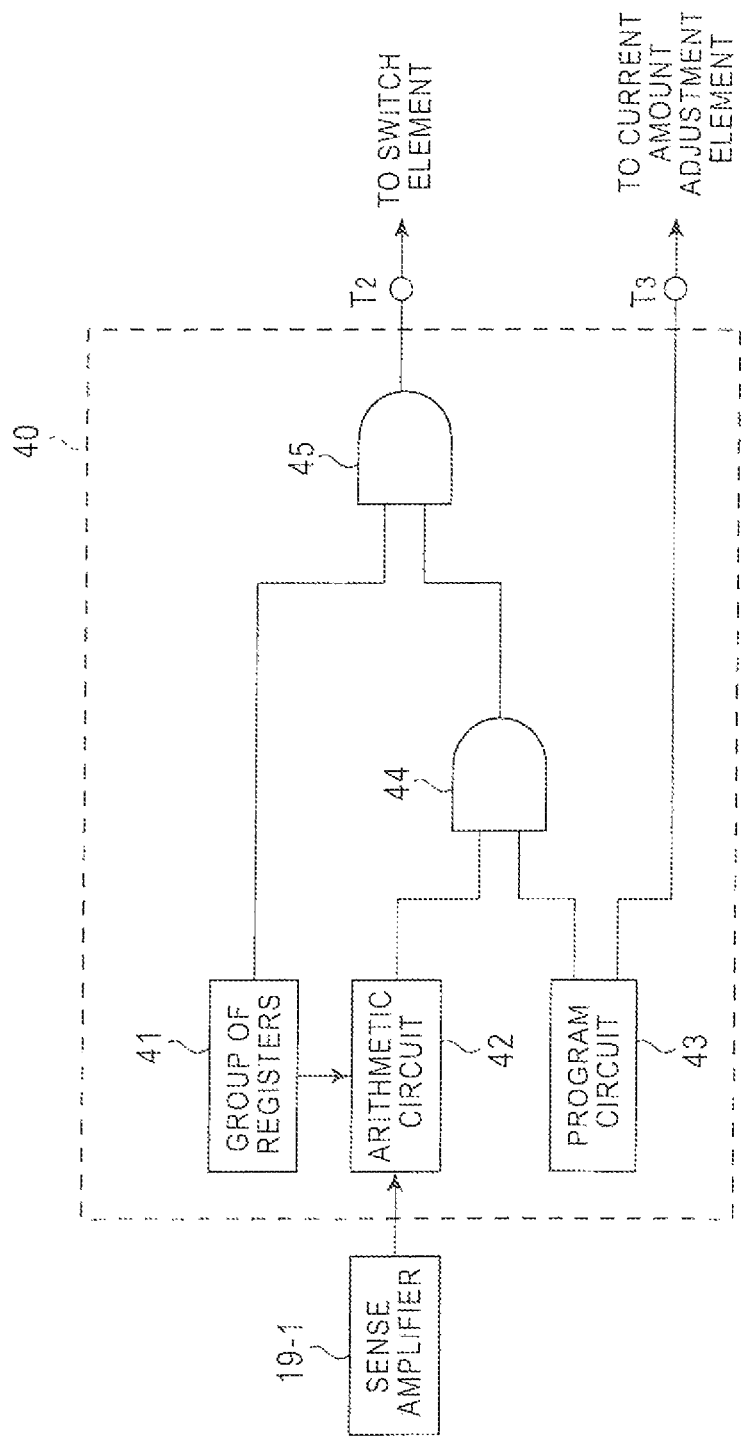
FIG. 3 illustrates a schematic configuration of a control circuit for supplying a driving signal to the current path switching circuit of the nonvolatile semiconductor memory shown in FIG. 1.

First, the structure of a nonvolatile semiconductor memory according to the embodiment will be described with reference to FIGS. 1 to 3.

Figure 1:
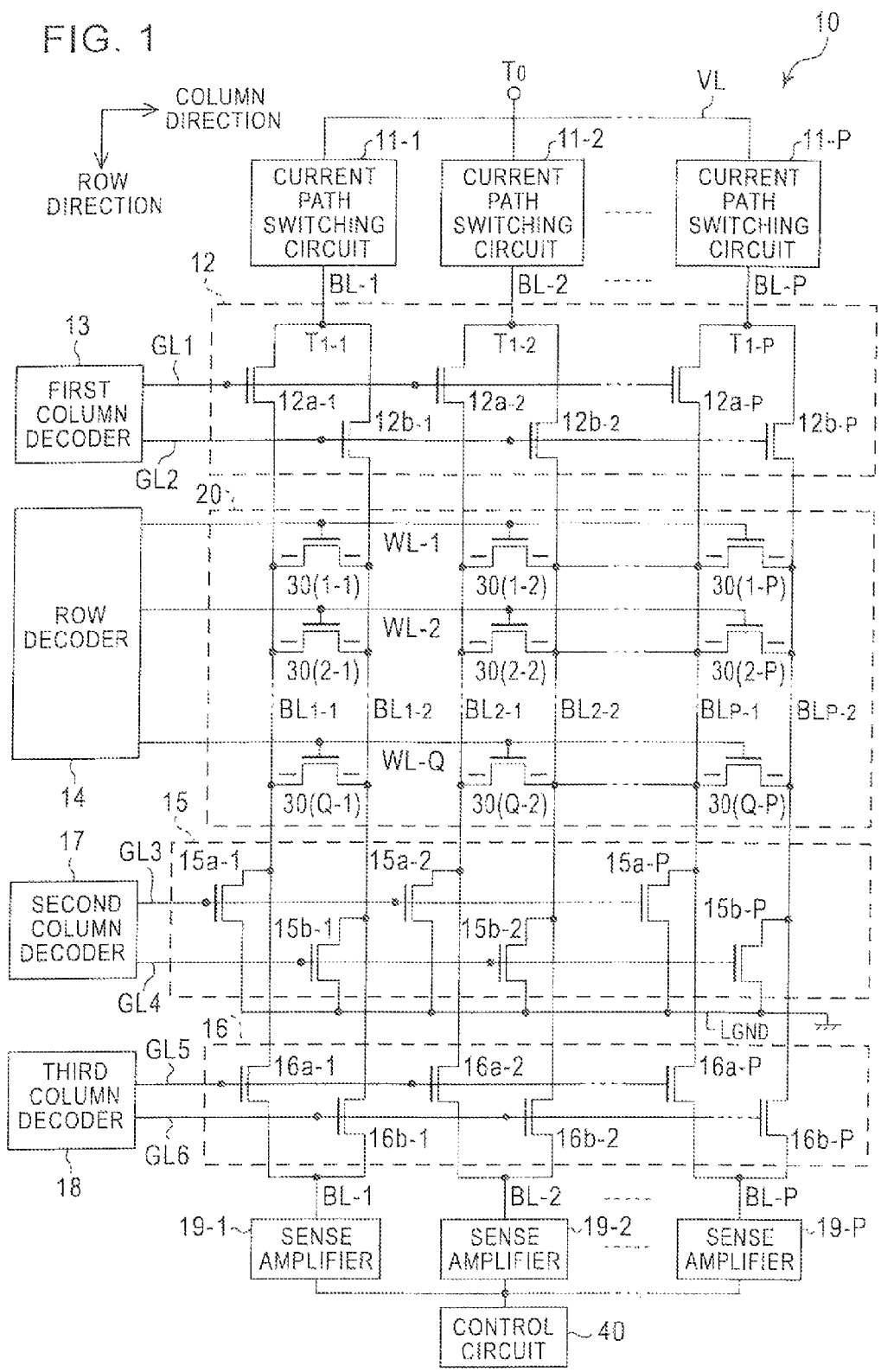
FIG. 1 shows a schematic configuration of a nonvolatile semiconductor memory according to an embodiment of the present invention.

As shown in FIG. 1, the nonvolatile semiconductor memory 10 includes an external power terminal $T_0$, and a plurality of current path switching circuits 11-1, 11-2, ..., 11-P which are connected to the external power terminal $T_0$ via a common power supply line VL. The nonvolatile semiconductor memory 10 also includes a first group of switch elements 12 connected to the respective current path switching circuits 11-1, 11-2, ..., 11-P, a first column decoder 13 for supplying a driving signal to the first group of switch elements 12, and a memory array 20 connected to the first group of switch elements 12. The nonvolatile semiconductor memory 10 also includes a row decoder 14 for supplying a driving signal to the memory array 20, a second group of switch elements 15 connected to the memory array 20, a third group of switch elements 16, and a second column decoder 17 for supplying a driving signal to the second group of switch elements 15. The nonvolatile semiconductor memory 10 also includes a third column decoder 18 for supplying a driving signal to the third group of switch elements 16, a plurality of sense amplifiers 19-1, 19-2, ..., 19-P connected to the third group of switch elements 16, and a control circuit 40 connected to the sense amplifiers 19-1, 19-2, ..., 19-P.

The memory array 20 includes P first sub-bit lines $BL_{1-1}$, $BL_{2-1}$, ..., $BL_{P-1}$, P second sub-bit lines $BL_{1-2}$, $BL_{2-2}$, ..., $BL_{P-2}$, and Q word lines WL-1, ..., WL-Q arranged so as to extend perpendicularly to the first sub-bit lines $BL_{1-1}$, $BL_{2-1}$, ..., $BL_{P-1}$, and the second sub-bit lines $BL_{1-2}$, $BL_{2-2}$, ..., $BL_{P-2}$.

The first sub-bit lines $BL_{1-1}$, $BL_{2-1}$, ..., $BL_{P-1}$, and the second sub-bit lines $BL_{1-2}$, $BL_{2-2}$, ..., $BL_{P-2}$ extend in the column direction, and the word lines WL-1, ..., WL-Q extend in the row direction. When which one of the first sub-bit lines $BL_{1-1}$, $BL_{2-1}$, ..., $BL_{P-1}$ is not specified in the following description, it is referred to simply as the "first sub-bit line BL." When which one of the second sub-bit lines $BL_{1-2}$, $BL_{2-2}$, ..., $BL_{P-2}$ is not specified in the following description, it is referred to simply as the "second sub-bit line BL." Likewise, when which one of the word lines WL-1, ..., WL-Q is not specified, it is referred to simply as the "word line WL."

A pair of the first sub-bit line BL and the second sub-bit line BL forms a main bit line BL. Specifically, the first sub-bit line $BL_{1-1}$ and the second sub-bit line $BL_{1-2}$ together form the main bit line BL-1, the first sub-bit line $BL_{2-1}$ and the second sub-bit line $BL_{2-2}$ together form the main bit line BL-2, and the first sub-bit line $BL_{P-1}$ and the second sub-bit line $BL_{P-2}$ together form the main bit line BL-P. Thus, P pairs of bit lines are provided in the memory array 20. The main bit lines BL-1, . . . , BL-P are connected to the respective current path switching circuits 11-1, . . . , 11-P, and the respective sense amplifiers 19-1, . . . , 19-P. Specifically, the main bit line BL-1 is connected to the current path switching circuit 11-1 and the sense amplifier 19-1, the main bit line BL-2 is connected to the current path switching circuit 11-2 and the sense amplifier 19-2, and the main bit line BL-P is connected to the current path switching circuit 11-P and the sense amplifier 19-P. When which one of the main bit lines BL-1, . . . , BL-P is not specified in the following description, it is referred to simply as the "main bit line BL."

P×Q memory cells 30(1-1), . . . , 30(1-P), 30(2-1), . . . , 30(2-P), 30(Q-1), . . . , 30(Q-P), each of which has an n-type MOSFET (Metal-Oxide-Semiconductor Field-Effect Transistor) structure, are arranged at intersections between the first sub-bit lines BL, the second sub-bit lines BL, and the word lines WL. When which one of the memory cells is not specified, it is referred to simply as the "memory cell 30." For example, the memory array 20 has 8 first sub-bit lines BL (P=8), 8 second sub-bit lines BL (P=8), 8 word lines WL (Q=8), and 128 memory cells 30 (P×2×Q=128). It should be noted that these numbers (P and Q) are adjusted (altered) depending on the memory capacity of the nonvolatile semiconductor memory 10 and/or the number of memory cells 30 to which data is simultaneously written.

Gates of the memory cells 30 are connected to the word lines WL-1, . . . , WL-Q, and drains and sources of the memory cells 30 are connected to the first sub-bit lines BL and the second sub-bit lines BL, respectively. In FIG. 1, assuming that the left side of the memory cell 30 is the drain and the right side thereof is the source, the gate of the memory cell 30(1-1) is connected to the word line WL-1, the drain thereof is connected to the first sub-bit line $BL_{1-1}$, and the source thereof is connected to the second sub-bit line $BL_{1-2}$. By supplying a write voltage between the first and second sub-bit lines BL constituting the main bit line BL, the write voltage is supplied between the drain and the source of the memory cell 30. Each of the memory cells 30 includes one charge storage section on the drain side and another charge storage section on the source side.

The row decoder 14 selects one of the word lines WL-1, . . . , WL-Q on the basis of a control signal supplied from the control circuit 40, and supplies a gate signal to the selected one of the word lines. In a write process performed by the nonvolatile semiconductor memory 10, a common gate signal is supplied to the gate terminals of the memory cells 30 irrespective of the values of the stored data.

The first group of switch elements 12 has P drain selectors 12a-1, 12a-2, . . . , 12a-P and P source selectors 12b-1, 12b-2, . . . , 12b-P, each of which has an n-type MOSFET structure. When which one of the drain selectors 12a-1, . . . , 12a-P is not specified, it is referred to simply as the "drain selector 12a." When which one of the source selectors 12b-1, . . . , 12b-P is not specified, it is referred to simply as the "source selector 12b." The drain selectors 12a and the source selectors 12b are connected to the respective drains and the respective sources of the memory cells 30 via the first and second sub-bit lines BL. Specifically, the drain of the drain selector 12a-1 is connected to the drain of each of the memory cells 30(1-1), 30(2-1), . . . , 30(Q-1) via the first sub-bit line $BL_{1-1}$, and the drain of the source selector 12b-1 is connected to the source of each of the memory cells 30(1-1), 30(2-1), . . . , 30(Q-1) via the second sub-bit line $BL_{1-2}$. The drain selectors 12a and the source selectors 12b are connected to the current path switching circuits 11-1, 11-2, . . . , 11-P via nodes $T_{1-1}, T_{1-2}, \ldots, T_{1-P}$ and the main bit lines BL-1, . . . , BL-P, respectively. Specifically, the source of the drain selector 12a-1 and the source of the source selector 12b-1 are connected to the current path switching circuit 11-1 via the node $T_{1-1}$ and the main bit line BL-1. The drain selectors 12a-1, . . . , 12a-P are connected to the first column decoder 13 by a common gate signal supply line GL1, and the source selectors 12b-1, . . . , 12b-P are connected to the first column decoder 13 by a common gate signal supply line GL2.

The first column decoder 13 selects either the gate signal supply line GL1 or the gate signal supply line GL2 on the basis of a control signal supplied from the control circuit 40, and supplies a gate signal to the selected one of the gate signal supply lines. By supplying the gate signal to the selected one of the gate signal supply lines, a current flowing from the external power terminal $T_0$ via the current path switching circuits 11-1, . . . , 11-P flows into the drains or the sources of the memory cells 30 via the first sub-bit lines BL or the second sub-bit lines BL. Specifically, if the gate signal supply line GL1 is selected, the drain selectors 12a-1, . . . , 12a-P transit to an ON state so that the current flows into the drains of the memory cells 30 via the first sub-bit lines $BL_{1-1}, BL_{2-1}, \ldots, BL_{P-1}$ (i.e., a predetermined voltage is applied).

Since the nonvolatile semiconductor memory 10 has the first group of switch elements 12 and the memory array 20, it is possible to simultaneously store different data in the P memory cells 30 connected to a single word line WL.

The second group of switch elements 15 has P drain selectors 15a-1, . . . , 15a-P and P source selectors 15b-1, . . . , 15b-P, each of which has an n-type MOSFET structure. When which one of the drain selectors 15a-1, . . . , 15a-P is not specified, it is referred to simply as the "drain selector 15a." When which one of the source selectors 15b-1, . . . , 15b-P is not specified, it is referred to simply as the "source selector 15b." The drain selectors 15a and the source selectors 15b are connected to the respective drains and the respective sources of the memory cells 30 via the first and second sub-bit lines BL. Specifically, the source of the drain selector 15a-1 is connected to the drain of each of the memory cells 30(1-1), 30(2-1), . . . , 30(Q-1) via the first sub-bit line $BL_{1-1}$, and the source of the source selector 15b-1 is connected to the source of each of the memory cells 30(1-1), 30(2-1), . . . , 30(Q-1) via the second sub-bit line $BL_{1-2}$. Each of the drain selectors 15a and the source selectors 15b is connected to a ground potential. Specifically, the sources of the drain selectors 15a and the source selectors 15b are connected to a ground potential via a common ground line $L_{GND}$. The drain selectors 15a-1, . . . , 15a-P are connected to the second column decoder 17 by a common gate signal supply line GL3, and the source selectors 15b-1, . . . , 15b-P are also connected to the second column decoder 17 by a common gate signal supply line GL4.

The third group of switch elements 16 has P drain selectors 16a-1, . . . , 16a-P and P source selectors 16b-1, . . . , 16b-P, each of which has an n-type MOSFET structure. When which one of the drain selectors 16a-1, . . . , 16a-P is not specified, it is referred to simply as the "drain selector 16a." When which one of the source selectors 16b-1, . . . , 16b-P is not specified, it is referred to simply as the "source selector 16b." The drain selectors 16a and the source selectors 16b are connected to the respective drains and the respective sources of the memory cells 30 via the first and second sub-bit lines BL. Specifically, the source of the drain selector 16a-1 is connected to the drain of each of the memory cells 30(1-1), 30(2-1), ..., 30(Q-1) via the first sub-bit line $BL_{1-1}$, and the source of the source selector 16b-1 is connected to the source of each of the memory cells 30(1-1), 30(2-1), ..., 30(Q-1) via the second sub-bit line $BL_{1-2}$. The drain selectors 16a and the source selectors 16b are connected to the sense amplifiers 19-1, 19-2, ..., 19-P via the main bit lines BL-1, ..., BL-P, respectively. When which one of the sense amplifiers 19-1, 19-2, ..., 19-P is not specified, it is referred to simply as the "sense amplifier 19." Specifically, the drain selector 16a-1 and the source selector 16b-1 are connected to the sense amplifier 19-1 via the main bit line BL-1, the drain selector 16a-2 and the source selector 16b-2 are connected to the sense amplifier 19-2 via the main bit line BL-2, and the drain selector 16a-P and the source selector 16b-P are connected to the sense amplifier 19-P via the main bit line BL-P. That is, a single sense amplifier is connected to a pair of sub-bit lines (i.e., a single main bit line BL). The drain selectors 16a-1, ..., 16a-P are connected to the third column decoder 18 by a common gate signal supply line GL5, and the source selectors 16b-1, ..., 16b-P are also connected to the third column decoder 18 by a common gate signal supply line GL6.

The second column decoder 17 selects either the gate signal supply line GL3 or the gate signal supply line GL4 on the basis of a control signal supplied from the control circuit 40, and supplies a gate signal to the selected one of the gate signal supply lines. Similarly, the third column decoder 18 selects either the gate signal supply line GL5 or the gate signal supply line GL6 on the basis of a control signal supplied from the control circuit 40, and supplies a gate signal to the selected one of the gate signal supply lines. The control circuit 40 supplies the control signal to the second column decoder 17 and the third column decoder 18 such that the drain selectors 15a of the second group of switch elements 15 and the source selectors 16b of the third group of switch elements 16 simultaneously transit to the ON state or such that the source selectors 15b of the second group of switch elements 15 and the drain selectors 16a of the third group of switch elements 16 simultaneously transit to the ON state. There is no chance that the drain selectors 15a and 16a simultaneously transit to the ON state or the source selectors 15b and 16b simultaneously transit to the ON state. For example, when the drain selector 15a and the source selector 16b transit to the ON state, a current flows through the sense amplifier 19 in accordance with a charge stored on the source side (right side) of the memory cell 30. When the source selector 15b and the drain selector 16a transit to the ON state, a current flows through the sense amplifier 19 in accordance with a charge stored on the drain side (left side) of the memory cell 30. It should be noted that the second column decoder 17 and third column decoder 18 supply gate signals to the second group of switch elements 15 and the third group of switch elements 16 in order to read data from the memory cells 30.

The sense amplifiers 19 are connected to the drains of the drain selector 16a and the source selector 16b, respectively. Each of the sense amplifiers 19 is also connected to the control circuit 40. When gate signals are supplied by the second column decoder 17 and the third column decoder 18 and a current in accordance with the amount of charge stored in the memory cell 30 is thus supplied to the sense amplifier 19, the sense amplifier 19 measures the amount of charge stored in the memory cell 30 on the basis of the amount of current supplied thereto. Then, each of the sense amplifiers 19 supplies, to the control circuit 40, a data signal indicating the measurement result (measured value) of the amount of charge. In other words, the sense amplifier 19 serves as a charge amount measurement unit.

The control circuit 40 is connected to the first column decoder 13, the row decoder 14, the second column decoder 17, the third column decoder 18, and the sense amplifiers 19. The control circuit 40 supplies control signals to the first column decoder 13, the row decoder 14, the second column decoder 17, and the third column decoder 18 so as to control these decoders. Specifically, the control circuit 40 executes a data write program when data to be stored in the nonvolatile semiconductor memory 10 is given from outside. In this case, the control circuit 40 selects a memory cell 30 to which data is to be written and a charge storage section to which data is to be written, and supplies a control signal in accordance with the result of the selection to the first column decoder 13, the row decoder 14, and the second column decoder 17. When reading data, the control circuit 40 selects a memory cell 30 from which data is to be read and a charge storage section from which data is to be read, and supplies control signals in accordance with the result of the selection to the row decoder 14, the second column decoder 17, and the third column decoder 18.

Since the configurations of the current path switching circuits 11-1, 11-2, ..., 11-P are identical to one another, the current path switching circuit 11-1 will only be described in detail with reference to FIG. 2. The current path switching circuit 11-1 contains a switch element M1 having a p-type MOSFET structure, and a bypass circuit 21. The bypass circuit 21 has a switch element M2 and a current amount adjustment element M3 each of which has an n-type MOSFET structure. The switch element M1 is provided between the power supply line VL and the node $T_{1-1}$, and can start and stop the current supply from the power supply line VL to the memory cells 30. Specifically, a drain of the switch element M1 is connected to the power supply line VL, and a source of the switch element M1 is connected to the node $T_{1-1}$. The switch element M2 is provided between the power supply line VL and the current amount adjustment element M3, and can start and stop the current supply from the power supply line VL to the current amount adjustment element M3. Specifically, a source of the switch element M2 is connected to the power supply line VL, and a drain of the switch element M2 is connected to a source of the current amount adjustment element M3. The current amount adjustment element M3 is connected to a ground potential, and can adjust current flowing to the ground potential. Specifically, a drain of the current amount adjustment element M3 is connected to the ground potential.

Each of the switch elements M1 and M2 is connected to a signal input terminal $T_2$. The control circuit 40 is connected to the signal input terminal $T_2$. With such a configuration, one of the switch element M1 and the switch element M2 is turned on in accordance with a gate signal supplied from the control circuit 40 via the signal input terminal $T_2$, and the other switch element is turned off. A gate of the current amount adjustment element M3 is connected to a signal input terminal $T_3$. The control circuit 40 is connected to the signal input terminal $T_3$. With such a configuration, the current amount adjustment element M3 is turned ON or OFF in accordance with a gate signal supplied from the control circuit 40 via the signal input terminal $T_3$. The current amount adjustment element M3 can adjust the amount of current flowing through the bypass circuit 21 in accordance with the supplied gate voltage.

It is preferred that the amount of current flowing through the bypass circuit 21 is equal to the amount of current flowing when writing data to the memory cell 30 by adjusting the gate voltage supplied to the current amount adjustment element M3. By doing so, it is possible to consume the same amount of current as that consumed when writing data even in a case where data is not actually written. However, since electrical characteristics of the memory cells 30 are different from one another, it is not easy to set the amount of current flowing through the bypass circuit 21 equal to the amount of current flowing when writing data to the memory cells 30. Therefore, it is preferred that the amount of current flowing through the bypass circuit 21 is smaller than the maximum amount of current which is calculated (predicted) from an average amount of current flowing when writing data to the memory cells 30. This is because if the amount of current flowing through the bypass circuit 21 is larger than the maximum amount of current, the amount of current consumed by the nonvolatile semiconductor memory 10 as a whole is unnecessarily increased. In view of these facts, the gate voltage supplied to the gate of the current amount adjustment element M3 is about 1 V to about 2 V, for example.

Since the current path switching circuit 11-1 has the above-described configuration, it is possible to cause a current to flow from the external power terminal $T_0$ to the memory cells 30, or it is possible to flow a current from the external power terminal $T_0$ to the ground potential.

Although the configurations of the current path switching circuits 11-1, 11-2, ..., 11-P are identical to one another, a gate signal supplied from the control circuit 40 to the signal input terminal $T_2$ and the signal input terminal $T_3$ is different for each of the current path switching circuits 11-1, 11-2, ..., 11-P.

It should be noted that the current amount adjustment element M3 may be connected to a predetermined terminal other than the ground potential. In such a case, a current flows from the external power terminal $T_0$ to that terminal.

Next, a gate signal supplied to each of the signal input terminals $T_2$ and $T_3$ of the current path switching circuit 11-1 will be described with reference to FIG. 3.

As described above, each of the signal input terminals $T_2$ and $T_3$ of the current path switching circuit 11-1 is connected to the control circuit 40. The control circuit 40 includes a group of registers 41, an arithmetic circuit 42, a program circuit 43, and AND gate circuits 44 and 45.

The group of registers 41 is composed of a plurality of registers, and each register stores data to be stored in each of the memory cells 30. For example, the group of registers 41 is composed of the same number of registers as that of the memory cells 30. The group of registers 41 supplies, to the arithmetic circuit 42, identification data of each memory cell 30 (identification number of that memory cell) along with data to be stored in the memory cell 30. Specifically, the group of registers 41 supplies identification data of one of the memory cells 30(1-1), 30(2-1), ..., and 30(Q-1) and the data to be stored therein. For example, when the word line WL-1 is selected and data is read, the identification data of the memory cell 30(1-1) and the data to be stored in the memory cell 30(1-1) are supplied to the arithmetic circuit 42.

The group of registers 41 and the sense amplifier 19-1 are connected to the arithmetic circuit 42. The group of registers 41 supplies data to be stored to the arithmetic circuit 42, and data read from the sense amplifier 19-1 is supplied to the arithmetic circuit 42. The arithmetic circuit 42 compares the data supplied from the sense amplifier 19-1 with the data supplied from the group of registers 41, and determines whether the data supplied from the sense amplifier 19-1 coincides with the data supplied from the group of registers 41. For example, if the word line WL-1 is selected and data is read, the data to be stored in the memory cell 30(1-1), which has been stored in the register, is compared with the data which is actually stored in the memory cell 30(1-1). The arithmetic circuit 42 supplies a signal indicating the result of the determination to an input terminal of the AND gate circuit 44. For example, when they coincide with each other, "0" is supplied, and when they do not coincide with each other, "1" is supplied.

The program circuit 43 is connected to the input terminal of the AND gate circuit 44, and supplies, to the AND gate circuit 44, a signal indicating whether the write program is currently running. For example, when the write program is currently running, "1" is supplied from the program circuit 43, and when it is not running, "0" is supplied. Moreover, the program circuit 43 is connected to the signal input terminal $T_3$ of the current path switching circuit 11-1, and supplies a gate signal of about 1 V to about 2 V when the program is running. Upon the receiving this gate signal, the current amount adjustment element M3 transits to the ON state.

The arithmetic circuit 42 and the program circuit 43 are connected to the input terminal of the AND gate circuit 44. When the AND gate circuit 44 receives, from the arithmetic circuit 42, a signal indicating that it has been determined that the data supplied from the sense amplifier 19-1 does not coincide with the data supplied from the group of registers 41 (i.e., "1") and receives, from the program circuit 43, a signal indicating that the program is running (i.e., "1"), the AND gate circuit 44 supplies, to the AND gate circuit 45, a signal which validates a signal supplied from the group of registers 41 to the AND gate circuit 45. For example, it is assumed that a signal which validates a signal supplied from the group of registers 41 to the AND gate circuit 45 is "1", and a signal which invalidates a signal supplied from the group of registers 41 to the AND gate circuit 45 is "0".

The output terminals of the group of registers 41 and the AND gate circuit 44 are connected to the input terminal of the AND gate circuit 45. Only when a signal which validates a signal supplied from the group of registers 41 to the AND gate circuit 45 (i.e., "1") is supplied from the AND gate circuit 44, the AND gate circuit 45 supplies a data signal stored in the group of registers 41 to the signal input terminal $T_2$ of the current path switching circuit 11-1.

The control circuit 40 includes a plurality of AND gate circuits 44 and a plurality of AND gate circuits 45 so as to correspond to the current path switching circuits 11-1, 11-2, ..., 11-P. Thus, the control circuit 40 can supply a gate signal to each of the signal input terminals $T_2$ and $T_3$ of the current path switching circuit 11-1, and simultaneously the control circuit 40 can supply gate signals to the signal input terminals $T_2$ and $T_3$ of the other current path switching circuits 11-2, ..., 11-P. The control circuit 40 can supply an individual gate signal to each of the current path switching circuits 11-1, ..., 11-P and adjust so that a current flows into either the memory cell 30 or the ground potential for each of the current path switching circuits.

With the configuration of the current path switching circuits 11-1, ..., 11-P and the gate signals supplied to the current path switching circuits 11-1, ..., 11-P, a current flowing toward the memory cell 30 is supplied from those current path switching circuits in which the switch element M1 is in the ON state and the switch element M2 is in the OFF state. Thus, a charge is stored in the memory cell 30. On the other hand, a current flowing toward the memory cell 30 is not supplied from those current path switching circuits in which the switch element M1 is in the OFF state and the switch element M2 is in the ON state. Thus, no charge is stored in the memory cell 30, and a certain amount of current flows to the ground potential via the bypass circuit 21. This "certain amount of current" is equal to or less than the amount of current flowing toward the memory cell 30 when writing data to the memory cell 30.

In the illustrated embodiment, since the current path switching circuits 11-1, . . . , 11-P are connected to those memory cells 30 to which data is written simultaneously, an amount of current equal to or less than that during write operation flows to the ground potential via the bypass circuit, even in those current path switching circuits which are connected to those memory cells 30 for which the data writing has been completed (a predetermined amount of charge is already stored in such memory cells). Accordingly, the load of the nonvolatile semiconductor memory 10 is prevented from varying, and the amount of current flowing through the nonvolatile semiconductor memory 10 and the memory cells 30 being written is also prevented from varying. Therefore, the nonvolatile semiconductor memory 10 of this embodiment is capable of writing data to the memory cells 30 with high precision while suppressing variations in the amount of current during data writing operation.

Figure 4:
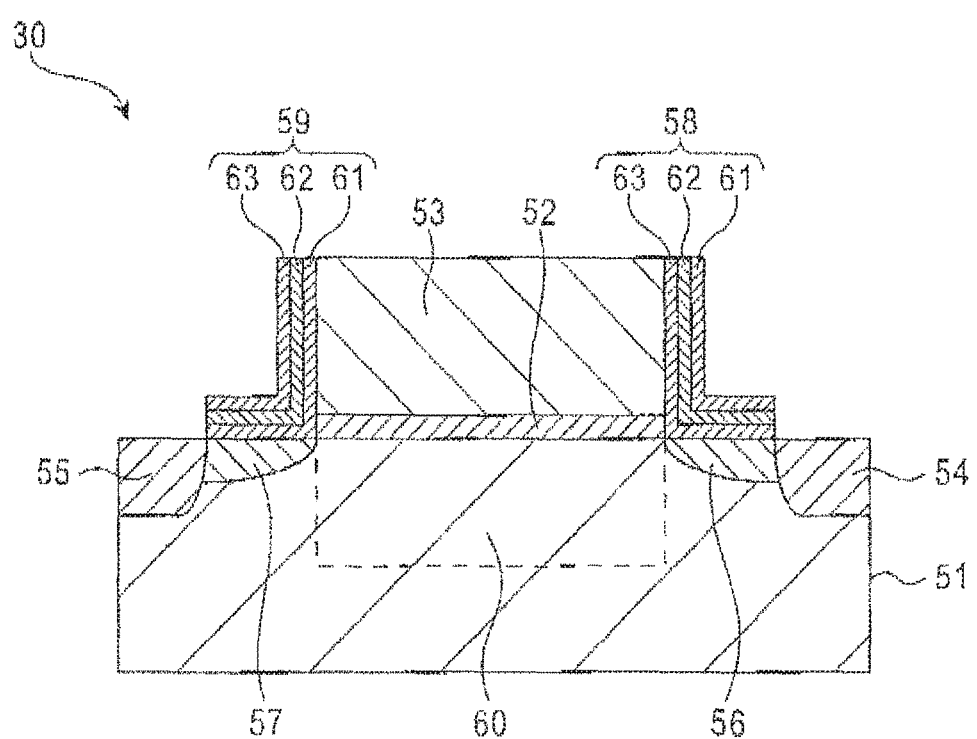
FIG. 4 is a cross sectional view of a memory cell in the nonvolatile semiconductor memory shown in FIG. 1.

The structure of the memory cell 30 of the nonvolatile semiconductor memory 10 and the principles of data writing, reading, and erasing with respect to the memory cell 30 will be described with reference to FIG. 4. FIG. 4 is a cross sectional view showing the structure of the memory cell 30.

As shown in FIG. 4, the memory cell 30 has a gate electrode 53 which is formed on an upper surface of a p-type silicon substrate 51 with a gate oxide film 52 interposed therebetween. The gate electrode 53 is made of polysilicon, and the gate oxide film 52 is made of $SiO_2$. A source region 54 and a drain region 55, each of which contains n-type impurities at a high concentration, are formed on the surface of the silicon substrate 51 at positions interposing the gate electrode 53 therebetween. A surface region of the silicon substrate 51 under the gate electrode 53 is a channel region 60 in which a current path is formed during the activation of an n-type MOSFET. Between the channel region 60 and the source region 54 and between the channel region 60 and the drain region 55, there are provided n-type extension regions 56 and 57 having a relatively low impurity concentration. The extension regions 56 and 57 are adjacent to the source region 54 and the drain region 55. The extension regions 56 and 57 are provided for efficiently injecting a charge into first and second charge storage sections (will be described later).

The first charge storage section 58 is provided on the source-side extension region 56, and the second charge storage section 59 is provided on the drain-side extension region 57. Each of the first and second charge storage sections 58 and 59 is composed of an ONO-layered insulating film made of a silicon oxide film 61, a silicon nitride film 62, and a silicon oxide film 63. The first and second charge storage sections 58 and 59 extend over the extension regions 56 and 57 and along the side walls of the gate electrode 53, respectively. Thus, it is possible to ensure the storing and holding of a charge. Since the first and second charge storage sections 58 and 59 are provided spaced apart from each other, each charge storage section 58, 59 can independently store and hold a charge.

Next, the principles of data writing, reading and erasing with respect to the memory cell 30 having such a structure will be described. It should be noted that the following description deals with a case where data writing, reading and erasing are performed with respect to the second charge storage section 59 on the drain side.

In order to write data to the second charge storage section 59, a positive voltage (e.g., +5 V) is applied to the gate electrode 53, a positive voltage, which is a write voltage, (e.g., +5 V) is applied to the drain region 55, and the source region 54 and the silicon substrate 51 are set to a ground potential (0 V). Thus, an electric field concentrates in the drain-side extension region 57, and hot electrons are generated inside the extension region 57 due to impact ionization. Some hot electrons move beyond an energy barrier generated between the extension region 57 and the silicon oxide film 61 of the second charge storage section 59 and is injected into and held in the silicon nitride film 62. By associating the amount of charge injected into the second charge storage section 59 with the stored data, it is possible to write four values of data ("00", "01", "10" and "11") to the second charge storage section 59. It is assumed here that the amount of injected charge when storing data "00" is $C_{00}$ and takes the largest value, the amount of injected charge when storing data "01" is $C_{01}$ and smaller than $C_{00}$ ($C_{01} < C_{00}$), the amount of injected charge when storing data "10" is $C_{10}$ and is smaller than $C_{01}$ ($C_{10} < C_{01}$), and the amount of injected charge when storing data "11" is $C_{11}$ and equal to zero ($C_{11} = 0$). For example, it is possible to make equal the amount of injected charge required for overwriting data from "11" to "10" ($C_{10} - C_{11}$), the amount of injected charge required for overwriting data from "10" to "01" ($C_{01} - C_{10}$), and the amount of injected charge required for overwriting data from "01" to "00" ($C_{00} - C_{01}$). That is, it is possible to set the amounts of injected charge so as to satisfy $C_{00} = 3C_{10}$ and $C_{10} = 2C_{10}$.

In order to read data from the second charge storage section 59, a positive voltage (e.g., +2 V) is applied to the gate electrode 53, a positive voltage, which is a readout voltage, (e.g., +1.8 V) is applied to the source region 54, and the drain region 55 and the silicon substrate 51 are set to a ground potential (0 V). Thus, the readout current flows from the source region 54 to the drain region 55. The magnitude of the readout current varies depending on the amount of charge held in the second charge storage section 59. Specifically, as the amount of charge held in the second charge storage section 59 is larger, the readout current becomes smaller. Thus, by measuring the magnitude of the readout current, it is possible to identify data stored in the second charge storage section 59 (i.e., the amount of stored charge).

In order to erase data stored in the second charge storage section 59, a positive voltage (e.g., +5 V) is applied to the drain region 55, 0 V or a negative voltage (e.g., −5 V) is applied to the gate electrode 53, and the source region 54 and the silicon substrate 51 are set to the ground potential (0 V). Thus, hot holes generated in the vicinity of the drain region 55 are injected into the second charge storage section 59. As a result, a charge (electrons) held in the second charge storage section 59 is neutralized, thereby erasing the data.

It should be noted that the data writing, reading and erasing with respect to the first charge storage section 58 on the source side can be realized by swapping voltages to be applied to the source side and voltages to be applied to the drain side with each other.

The operation of the nonvolatile semiconductor memory 10 of this embodiment will be described with reference to FIGS. 1 to 3 and FIG. 5. FIG. 5 depicts changes in amounts of charge stored in the memory cells 30. It should be noted that the following description is directed to a case assuming that the word line WL-1 is selected, data "00" is stored in the memory cells 30(1-1) and 30(1-2), data "01" is stored in the memory cells 30(1-3) and 30(1-4), data "10" is stored in the memory cells 30(1-5) and 30(1-6), and data "11" is stored in the memory cells 30(1-7), . . . , 30(1-P). That is, no charge is injected into the memory cells 30(1-7), . . . , 30(1-P). It is assumed in the following description that a charge storage section into which a charge is injected (i.e., data is written) is positioned on the drain side of each memory cell 30 (i.e., the left side of the memory cell in FIG. 1).

In this embodiment, by injecting a charge into each memory cell 30 a plurality of times, an amount of charge in each memory cell 30 is adjusted to the amount of charge corresponding to the data to be stored. Each time an injection of a charge is finished, data is once read, and it is determined whether an amount of charge stored in each memory cell 30 has reached a predetermined amount. Specifically, write operation is performed as follows.

First, the write program is started, and a gate signal for turning on the current amount adjustment element M3 is supplied to the signal input terminal $T_3$ of each of the current path switching circuits 11-1, . . . , 11-P. At the same time, a gate signal for turning on the switch element M1 and turning off the switch element M2 is supplied to a terminal T1 of each of those current path switching circuits 11-1, . . . , 11-6 which are connected to the memory cells 30(1-1), . . . , 30(1-6) into which a charge is injected. With the driving of the current path switching circuits 11-1, . . . , 11-6, a predetermined amount of current flows toward the nodes $T_{1-1}$, . . . , $T_{1-6}$ in the current path switching circuits 11-1, . . . , 11-6. On the other hand, a gate signal for making the switch element M1 transit to the OFF state and making the switch element M2 transit to the ON state is supplied to the terminal T1 of each of the current path switching circuits 11-7, . . . , 11-P connected to the memory cells 30(1-7), . . . , 30(1-P) into which no charge is injected. With the driving of the current path switching circuits 11-7, . . . , 11-P, a predetermined amount of current flows to the ground potential via the bypass circuit 21 in each of the current path switching circuits 11-7, . . . , 11-P. In this instance, an amount of current equal to or less than that during the write operation to the memory cells 30(1-7), . . . , 30(1-P) flows through each of the bypass circuits 21.

Next, the control circuit 40 supplies, to the first column decoder 13, a control signal for selecting the gate signal supply line GL1, and the first column decoder 13 supplies a gate signal to the gates of the drain selectors 12a-1, . . . , 12a-P. At the same time, the control circuit 40 supplies, to the row decoder 14, a control signal for selecting the word line WL-1, and the row decoder 14 supplies a gate signal having the voltage value of +5 V to the gates of the memory cells 30(1-1), . . . , 30(1-P). At the same time, the control circuit 40 supplies, to the second column decoder 17, a control signal for selecting the gate signal supply line GL4, and the second column decoder 17 supplies a gate signal to the gates of the source selectors 15b-1, . . . , 15b-P. Thus, first data writing to the memory cells 30(1-1), . . . , 30(1-6) is started.

After a predetermined amount of time passes, the control circuit 40 supplies, to the first column decoder 13, a control signal for terminating the selection of the gate signal supply line GL1, and therefore the supply of the gate signal to the gates of the drain selectors 12a-1, . . . , 12a-P is stopped. At the same time, the control circuit 40 supplies, to the third column decoder 18, a control signal for selecting the gate signal supply line GL5, and the third column decoder 18 supplies a gate signal to the gates of the drain selectors 16a-1, . . . , 16a-P. At the same time, the control circuit 40 supplies, to the row decoder 14, a control signal for changing the gate voltage value to +2 V, and the row decoder 14 supplies a gate signal having the voltage value of +2 V to the gates of the memory cells 30(1-1), . . . , 30(1-P). Thus, data readout is started with respect to the memory cells 30(1-1), . . . , 30(1-P). Pieces of data which have been read are supplied to the sense amplifiers 19-1, . . . , 19-P, respectively. In the sense amplifiers 19-1, . . . , 19-P, amounts of charge corresponding to the supplied data are calculated.

The predetermined amount of time is the average amount of time which is taken before the amount of charge carried by the memory cell 30 reaches the amount of charge required for storing data "10." However, the write speeds of the memory cells 30 are different from one another depending on the characteristics thereof. In this embodiment, as can be seen from FIG. 5, the memory cells 30(1-1), 30(1-3) and 30(1-5) have the average write speed, and therefore the amount of charge stored in the memory cells 30(1-1), 30(1-3) and 30(1-5) after the passage of the above-described predetermined amount of time becomes equal to the amount of charge required for storing data "10." On the other hand, the memory cell 30(1-2) has a slower writing speed which is about 75% of the average write speed. Thus, the amount of charge stored in the memory cell 30(1-2) after the passage of the above-described predetermined amount of time is only about 75% of the amount of charge required for storing data "10." The memory cells 30(1-4) and 30(1-6) have a write speed which is about 50% of the average write speed. Thus, the amount of charge stored in the memory cells 30(1-4) and 30(1-6) after the passage of the above-described predetermined amount of time is only about 50% of the amount of charge required for storing data "10."

When the first charge injection and data reading are completed, the predetermined amount of charge (i.e., the amount of charge corresponding to data "10") is stored in the memory cell 30(1-5). Therefore, data writing operation to the memory cell 30(1-5) is ended.

When the write program is started again (for the second time), a gate signal for making the current amount adjustment element M3 transit to the ON state is supplied to the signal input terminal $T_3$ of each of the current path switching circuits 11-1, . . . , 11-P. Data write operation is started in the memory cells 30(1-1) to 30(1-4), and 30(1-6) in a similar manner to the first data writing operation.

Since the amount of charge in the memory cell 30(1-5) has already reached the predetermined amount of charge (i.e., the amount of charge corresponding to data "10"), it is determined in the arithmetic circuit 42 that the amounts of charge coincide with each other, and a signal indicating such a coincidence (i.e., "0") is supplied to the AND gate circuit 44. When such a signal is supplied, a gate signal for making the switch element M1 transit to the OFF state and making the switch element M2 transit to the ON state is supplied to the signal input terminal $T_2$ of the current path switching circuit 11-5 connected to the memory cell 30(1-5). With such a driving of the current path switching circuit 11-5, the predetermined amount of current flows to the ground potential via the bypass circuit 21 in the current path switching circuit 11-5.

Since no charge is injected into the memory cells 30(1-7), . . . , 30(1-P), a gate signal for making the switch element M1 transit to the OFF state and making the switch element M2 transit to the ON state is supplied to the signal input terminal $T_2$ of each of the current path switching circuits 11-7, . . . , 11-P. Then, an amount of current equal to or less than that during the write operation to the memory cells 30(1-7), . . . , 30(1-P) flows through each of the bypass circuits 21 of the current path switching circuits 11-7, . . . , 11-P.

After the passage of the above-described predetermined amount of time, the second data reading is performed in the memory cells 30(1-1), . . . , 30(1-P) using the above-described data reading method. When the second charge injection and data readout are completed, the predetermined amount of charge is stored in the memory cells 30(1-3) and 30(1-6). Therefore, data write operation to the memory cells 30(1-3) and 30(1-6) is ended.

When the write program is started again (for the third time), a gate signal for making the current amount adjustment element M3 transit to the ON state is supplied to the signal input terminal $T_3$ of each of the current path switching circuits 11-1, . . . , 11-P. Data writing operation is started in the memory cells 30(1-1), 30(1-2), and 30(1-4) in a similar manner to the first data writing operation. Since no charge is injected into the memory cells 30(1-3), 30(1-5), . . . , 30(1-P), a gate signal for making the switch element M1 transit to the OFF state and making the switch element M2 transit to the ON state is supplied to the signal input terminal $T_2$ of each of the current path switching circuits 11-3, 11-5, . . . , 11-P. Then, an amount of current equal to or less than that during the write operation to the memory cells 30(1-3), 30(1-5), 30(1-7), . . . , 30(1-P) flows through each of the bypass circuits 21 of the current path switching circuits 11-3, 11-5, 11-7, . . . , 11-P.

After the passage of the above-described predetermined amount of time, the third data reading is performed in the memory cells 30(1-1), . . . , 30(1-P) using the above-described data reading method. When the third charge injection and data readout are completed, the predetermined amount of charge is stored in the memory cell 30(1-1). Therefore, data write operation to the memory cell 30(1-1) is ended.

When the write program is started again (for the fourth time), a gate signal for making the current amount adjustment element M3 transit to the ON state is supplied to the signal input terminal $T_3$ of each of the current path switching circuits 11-1, . . . , 11-P. Data write operation is started in the memory cells 30(1-2) and 30(1-4) in a similar manner to the first data write operation. Since no charge is injected into the memory cells 30(1-1), 30(1-3), 30(1-5), . . . , 30(1-P), a gate signal for making the switch element M1 transit to the OFF state and making the switch element M2 transit to the ON state is supplied to the signal input terminal $T_2$ of each of the current path switching circuits 11-1, 11-3, 11-5, . . . , 11-P. Then, an amount of current equal to or less than that during the write operation to the memory cells 30(1-1), 30(1-3), 30(1-5), . . . , 30(1-P) flows through each of the bypass circuits 21 of the current path switching circuits 11-1, 11-3, 11-5, . . . , 11-P.

After the passage of the above-described predetermined amount of time, the fourth data reading is performed in the memory cells 30(1-1), . . . , 30(1-P) using the above-described data reading method. When the fourth charge injection and data reading are completed, the predetermined amount of charge is stored in the memory cells 30(1-2) and 30(1-4). Therefore, data writing operation to the memory cells 30(1-1), . . . , 30(1-P) is ended. That is, the data writing to the nonvolatile semiconductor memory 10 is completed.

By repeating the operations of writing, reading, and determining the amounts of charge as described above, and by turning off the switch element M1 and turning on the switch element M2 and the current amount adjustment element M3 of each of those current path switching circuits which are connected to those memory cells 30 in which it is no longer necessary to inject a charge therein, it is possible to cause an amount of current equal to or less than that during the charge injection to flow even in those current path switching circuits which are connected to those memory cells 30 in which it is no longer necessary to inject a charge. By performing the write operation as described above with respect to the nonvolatile semiconductor memory 10, even if the memory cells 30 have different timings at which charge injection becomes unnecessary, the load of the nonvolatile semiconductor memory 10 is prevented from varying, and the amount of current flowing through the nonvolatile semiconductor memory 10 and the memory cells 30 being written is also prevented from varying. Therefore, the nonvolatile semiconductor memory 10 of this embodiment is capable of writing data to the memory cells 30 with high precision while suppressing variations in the amount of current during data write operation.

It should be noted that while it is assumed in the nonvolatile semiconductor memory 10 of the above-described embodiment that each of the memory cells 30 has two charge storage sections, the present invention is applicable to a case where each memory cell has a single charge storage section. In this case, wiring may be modified as follows: a bit line may be connected to a portion of the memory cell 30 having the charge storage section, and a ground potential may be connected to a portion of the memory cell 30 having no charge storage section. Thus, a single bit line may be connected to each memory cell, and a current path switching circuit may be connected to the single bit line.

Although data is simultaneously written to all of the memory cells 30 arranged in the same row direction (i.e., all of the memory cells 30 connected to the same word line WL) in the nonvolatile semiconductor memory 10 of the above-described embodiment, data may be simultaneously written to the memory cells 30(1-1), 30(1-3), . . . , 30(1-(P-1)) at one timing, and data may be simultaneously written to the memory cells 30(1-2), 30(1-4), . . . , 30(1-P) at another timing, for example. In such a case, the memory cells 30(1-1) and 30(1-2) of the nonvolatile semiconductor memory 10 may be connected to a common current path switching circuit, the memory cells 30(1-3) and 30(1-4) may be connected to another common current path switching circuit, and the memory cells 30(1-(P-1)) and 30(1-P) may be connected to still another common current path switching circuit. That is, those memory cells to which data is not simultaneously written are connected to a common current path switching circuit. This reduces the number of current path switching circuits.

This application is based on Japanese Patent Application No. 2010-146129 filed on Jun. 28, 2010, and the entire disclosure thereof is incorporated herein by reference.

What is claimed is:

1. A nonvolatile semiconductor memory comprising:
   a plurality of memory cells arranged in a matrix form;
   word lines connected to said plurality of memory cells;
   bit lines crossing said word lines and connected to said plurality of memory cells, respectively, such that a current is simultaneously supplied from a power supply line via said bit lines to said memory cells to write data to said memory cells;
   charge amount measurement sections for measuring amounts of charge stored in the corresponding ones of said memory cells, respectively;
   first current routes each being connected between said power supply line and a predetermined terminal being in a predetermined potential;

second current routes each connecting said power supply line to the corresponding ones of said bit lines; and a control circuit, connected to said charge amount measurement sections, for adjusting an amount of current supplied from said power supply line to each of said first current routes and said second current routes depending on a measured value of the amount of charge measured by said charge amount measurement section associated with the memory cell concerned;

wherein each of said first current routes includes a switch element connected to said power supply line, and a current amount adjustment element connected between the switch element and said predetermined terminal.

2. The nonvolatile semiconductor memory according to claim 1, wherein said current amount adjustment element includes a transistor having a MOSFET structure, and adjusts a current value of current to be supplied to said predetermined terminal depending on a driving voltage supplied from said control circuit.

3. The nonvolatile semiconductor memory according to claim 2, wherein the driving voltage is determined on the basis of electrical characteristics of said plurality of memory cells.

4. The nonvolatile semiconductor memory according to claim 1, wherein said charge amount measurement section includes a sense amplifier.

5. The nonvolatile semiconductor memory according to claim 1, wherein said control circuit adjusts an amount of current to be supplied to each of said first current routes so as to be less than or equal to an amount of current flowing through said memory cells during write operations to said memory cells, when determining via said charge amount measurement section that a predetermined amount of charge is already stored in said memory cell.

6. The nonvolatile semiconductor memory according to claim 1, wherein said predetermined terminal is in a potential to which a voltage smaller than a data writing voltage is applied.

7. The nonvolatile semiconductor memory according to claim 1, wherein said predetermined terminal is in a ground potential.

8. The nonvolatile semiconductor memory according to claim 1, wherein each of said memory cells includes a first charge storage section and a second charge storage section, each of said bit lines is defined by a pair of sub-bit lines, which are a first sub-bit line connected to the first charge storage section and a second sub-bit line connected to the second charge storage section, and the nonvolatile semiconductor memory further comprises a column decoder for selecting one of the first sub-bit line and the second sub-bit line.

* * * * *